United States Patent
Chun et al.

(10) Patent No.: US 8,956,919 B2
(45) Date of Patent: Feb. 17, 2015

(54) STRUCTURE FOR MULTI-ROW LEADFRAME AND SEMICONDUCTOR PACKAGE THEREOF AND MANUFACTURE METHOD THEREOF

(75) Inventors: Hyun A. Chun, Gyeonggi-do (KR); Jae Bong Choi, Gyeonggi-do (KR); Sung Won Lee, Seoul (KR); Sung Wuk Ryu, Seoul (KR); Hyuk Soo Lee, Gyeonggi-do (KR); Sai Ran Eom, Incheon (KR)

(73) Assignee: LG Innotek Co., Ltd., Seoul (KR)

( * ) Notice: Subject to any disclaimer, the term of this patent is extended or adjusted under 35 U.S.C. 154(b) by 142 days.

(21) Appl. No.: 13/142,172

(22) PCT Filed: Dec. 23, 2009

(86) PCT No.: PCT/KR2009/007724
§ 371 (c)(1),
(2), (4) Date: Oct. 14, 2011

(87) PCT Pub. No.: WO2010/074510
PCT Pub. Date: Jul. 1, 2010

(65) Prior Publication Data
US 2012/0038036 A1    Feb. 16, 2012

(30) Foreign Application Priority Data

Dec. 24, 2008   (KR) .................. 10-2008-0132887

(51) Int. Cl.
*H01L 21/00* (2006.01)
*H01L 23/495* (2006.01)
(Continued)

(52) U.S. Cl.
CPC ...... *H01L 21/4832* (2013.01); *H01L 23/49582* (2013.01); *H01L 24/29* (2013.01);
(Continued)

(58) Field of Classification Search
USPC ..... 438/111, 112, 123, FOR. 366, FOR. 367, 438/FOR. 377, FOR. 380; 257/666–677, 257/E23.031–E23.059
See application file for complete search history.

(56) References Cited

U.S. PATENT DOCUMENTS 7,053,492 B2    5/2006 Takahashi et al.
7,454,832 B2 *  11/2008 Sakai et al. ............... 29/846
(Continued)

FOREIGN PATENT DOCUMENTS

CN          1574319 A       2/2005
JP          S-60-130151     7/1985
(Continued)

OTHER PUBLICATIONS

Office Action dated Nov. 29, 2012 in Chinese Application No. 200980152298.5, filed Dec. 23, 2009.
(Continued)

*Primary Examiner* — Jasmine Clark
(74) *Attorney, Agent, or Firm* — Saliwanchik, Lloyd & Eisenschenk

(57) ABSTRACT

The present invention relates to a multi-row leadframe for semiconductor packaging, characterized by: forming a plating pattern on a leadframe material (first step); forming a protective pattern on the plating pattern (second step); and forming a nano pattern by using the protective pattern as a mask (third step), whereby a protective pattern is formed on an upper surface of a plating pattern to increase reliability of a product by preventing damage to a plating layer caused by etching solution during pattern formation of leadframe and to thereby solve the problem of using the plating layer as an etching mask.

11 Claims, 9 Drawing Sheets

(51) Int. Cl.
*H01L 21/48* (2006.01)
*H01L 23/00* (2006.01)

(52) U.S. Cl.
CPC ............ *H01L2224/48091* (2013.01); *H01L 2224/48247* (2013.01); *H01L 2224/73265* (2013.01); *H01L 2224/92247* (2013.01); *H01L 2924/01046* (2013.01); *H01L 2924/01078* (2013.01); *H01L 2924/01079* (2013.01); *H01L 24/48* (2013.01); *H01L 2224/32245* (2013.01); *H01L 2924/01067* (2013.01); *H01L 2924/01322* (2013.01); *H01L 2924/0132* (2013.01); *H01L 2924/01029* (2013.01)
USPC ........... 438/123; 438/111; 257/666; 257/677; 257/E23.005; 257/E23.041; 257/E23.053; 257/E23.054

(56) References Cited

U.S. PATENT DOCUMENTS

| | | | |
|---|---|---|---|
| 7,501,693 B2 * | 3/2009 | Chu et al. | 257/676 |
| 7,521,295 B2 * | 4/2009 | Iitani et al. | 438/123 |
| 2004/0056357 A1 | 3/2004 | Takahashi et al. | |

FOREIGN PATENT DOCUMENTS

| | | | |
|---|---|---|---|
| JP | 05-183083 A | | 7/1993 |
| JP | 10-237691 | | 9/1998 |
| JP | H-11-97612 | | 4/1999 |
| JP | 2002-076245 A | | 3/2002 |
| JP | 2004-071899 A | | 3/2004 |
| JP | 2005-317998 A | | 11/2005 |
| JP | 2006-253399 A | | 9/2006 |
| JP | 2009-055015 A | | 3/2009 |
| KR | 10-2001-0001160 A | | 1/2001 |
| KR | 20010001160 | * | 5/2001 |
| WO | WO-2007/018237 A1 | | 2/2007 |

OTHER PUBLICATIONS

Office Action dated Jan. 28, 2014 in Japanese Application No. 2011-543424.

Office Action dated Dec. 16, 2010 in Korean Application No. 10-2008-0132887.

Office Action dated Jul. 22, 2014 in Japanese Application No. 2011-543424.

* cited by examiner

PRIOR ART

FIG. 2
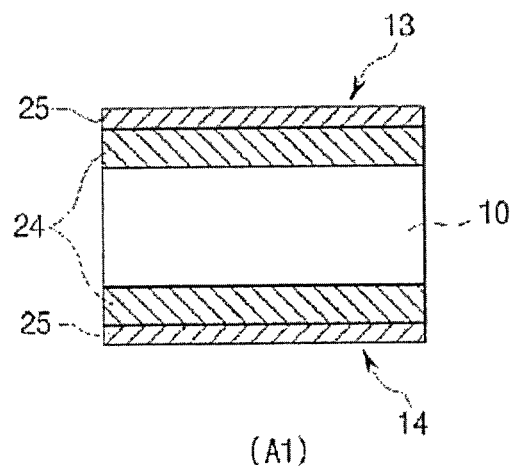
(A1)
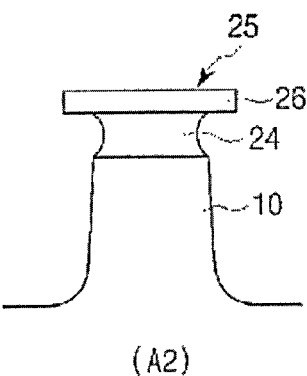
(A2)
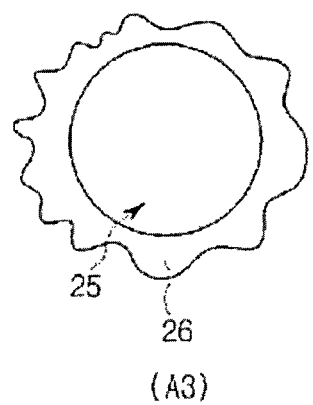
(A3)
PRIOR ART

STRUCTURE FOR MULTI-ROW LEADFRAME AND SEMICONDUCTOR PACKAGE THEREOF AND MANUFACTURE METHOD THEREOF

CROSS-REFERENCE TO RELATED APPLICATIONS

This application is the U.S. national stage application of International Patent Application No. PCT/KR2009/007724, filed Dec. 23, 2009, which claims priority to Korean Application No. 10-2008-0132887, filed Dec. 24, 2008, the disclosures of each of which are incorporated herein by reference in their entirety.

TECHNICAL FIELD

The present invention relates to structure for multi-row leadframe and semiconductor package thereof and manufacture method thereof, and more particularly to a technology capable of forming a protective pattern on an upper surface of a plating pattern to increase reliability of a product by preventing damage of a plating layer caused by etching solution during pattern formation of leadframe, and shortening a manufacturing process and reducing the lost material cost by dispensing with a removal process of plating burrs in the conventional manufacturing process.

BACKGROUND ART

Generally, a semiconductor chip package alone cannot receive electricity from outside to transmit or receive an electric signal, such that it is necessary to package a semiconductor chip to allow the semiconductor chip to receive the electric signal from and transmit the electric signal to the outside.

Recently, as the semiconductor chip package is manufactured in various configurations using various members such as leadframes, printed circuit boards and circuit films in consideration of reduced chip size, heat emitting capacity and improved electrically performing capacity, improved reliability and manufacturing cost.

Concomitant with recent advancement towards higher degree of integration and faster operation speed of semiconductor chips, it has become necessary to increase the number of input/output terminals (electrical leads) between the semiconductor chip and outside circuit substrate. To this end, a semiconductor chip package of multi-row leadframe mounted with leads having 2 or more rows that separately connect the chips with outside circuit is receiving attention and interest.

FIG. 1 illustrates an example of manufacturing a semiconductor device according to the prior art disclosed in the Korea patent Laid-open No. 10-2008-00387121.

According to order of the conventional semiconductor package process, after a resist film (11) is coated on the overall obverse and reverse surfaces of a lead frame material (10) constituted of Cu, a Cu alloy or an iron-nickel alloy (e.g., 42 alloy), the resist film (11) is exposed with a predetermined lead pattern and development is then carried out, thereby forming an etching pattern (12) of the plating mask. Then, the leadframe material (10) is subjected to all-over plating, and if the resist film (11) is removed, plating masks (13, 14) are formed on the obverse and the reverse surfaces {see FIG. 1 (a) to FIG. 1 (d)}.

Successively, after the entire lower surface (i.e., reverse surface side) is coated with another resist film (15), the upper surface side (i.e., the obverse surface side) is subjected to half etching by using a plating mask (13) as a resist mask. In this case, since that portion of the surface of the leadframe material 10 which is covered by the plating mask (13) is not etched, an element mounting portion (16) and a wire bonding portion (17) formed in advance by the resist film ultimately project. It should be noted that the surfaces of the element mounting portion (16) and the wire bonding portions (17) are covered by the plating mask (13) {see (e) and (f) of FIG. 1}.

Next, after removing the resist film 15 on the lower surface side, a semiconductor element 18 is mounted on the element mounting portion 16, and electrode pad portions of the semiconductor element 18 and the wire bonding portions 17 are wire bonded, the semiconductor element 18, bonding wires 20, and the wire bonding portions 17 are resin encapsulated. Reference numeral 21 denotes an encapsulating resin {see (g) and (h) of FIG. 1}.

Subsequently, the reverse surface side is subjected to half etching. At this time, the portion of the leadframe material 10 where the plating mask 14 is formed remains without being etched since the plating mask 14 acts as a resist mask. As a result, reverse surfaces of external connection terminal portions 22 and the element mounting portion 16 project. Since the external connection terminal portions 22 and the wire bonding portions 17 communicate with each other, the respective external connection terminal portions 22 (and the wire bonding portions 17 communicating therewith) are made independent and are electrically connected to the respective electrode pad portions of the semiconductor element 18. Since these semiconductor devices 23 are generally arranged in grid form and are manufactured simultaneously, they are diced and exfoliated, thereby manufacturing individual semiconductor devices 23 {see (i) and (j) of FIG. 1}.

However, with the (e) process in the above-described conventional semiconductor manufacturing process in a case when etching is carried out on the leadframe material portion 10 using the plating layer (13) on the upper surface as an etching mask, damage may be incurred by attack on the plating layer on the upper surface of the leadframe material during etching process, the damage of which may cause a fatal effect on the wirebonding and the product reliability.

Now, referring to FIG. 2 which is an enlarged view of a plating pattern portion (A portion) according to (g) process of the above-described process, where (A1) in FIG. 2 illustrates the conventional structure of plating layer (17) in FIG. 1. That is, the plating mask (17) utilized as the conventional plating mask, as illustrated in the drawing, is conventionally formed by providing, for instance, an Ni undercoat layer (24) on the upper surface of the leadframe material (10), and by further providing a noble metal plating (25). However, in the case when the etching is carried out using the plating pattern as a plating mask, the noble metal plating (25) is not eroded during etching, but the leadframe material (10) formed of copper or a copper alloy and the Ni undercoat (24) are eroded by an etching solution, as shown in (A2) and (A3) of FIG. 2. Hence, the periphery of the noble metal plating (25) assumes a foil-like shape, and is adhered to the periphery of each of the wire bonding portions (17), the element mounting portion (16), and the external connection terminal portions (22), thereby forming plating burrs (26. plating foils).

If such plating burrs (26) are present, the plating burrs (26) are exfoliated in the wire bonding process, the resin encapsulating process (i.e., molding process), and the like, causing defects in semiconductor devices including faulty wire bonding, and short-circuiting between terminals, and the like.

The conventional semiconductor manufacturing process inevitably generates plating burrs, such that it is necessary to add de-burring and cleaning processes in order to enhance the reliability.

To be more specific, the semiconductor package manufacturing method according to the prior art suffers from disadvantages in that additional processes should be carried out in which an intermediate product (i.e., the product immediately after half etching) is immersed in a water tank having a brush or an ultrasonic transducer to exfoliate the plating burrs and a cleaning process follows, thereby making the manufacturing method uneconomical. There is another disadvantage in that material loss increases due to generation of plating burrs.

There is still another disadvantage in that the plating layer using the noble metal is used as an etching mask, which in turn makes the periphery of strips noble metal plated, thereby increasing the material cost.

DISCLOSURE OF INVENTION

Technical Problem

The present invention has been devised in view of the above-described circumstances, and its object is to provide structure for multi-row leadframe and semiconductor package thereof and manufacture method thereof capable of forming a protective pattern on an upper surface of a plating pattern to increase reliability of a product by preventing damage of a plating layer caused by etching solution during pattern formation of leadframe, and shortening a manufacturing process and reducing the loss of material cost by dispensing with a de-burring process of plating burrs in the conventional manufacturing process.

Solution to Problem

According to an aspect of the present invention, there is provided a manufacturing method of multi-row leadframe, characterized by: forming a plating pattern on a leadframe material (first step); forming a protective pattern on the plating pattern (second step); and forming a nano pattern by using the protective pattern as a mask (third step), whereby an additional process of suppressing or eliminating the generation of plating burrs that is required in the multi-row leadframe manufacturing process according to the prior art is dispensed with, thereby simplifying the manufacturing process and reducing the manufacturing cost.

In some exemplary embodiments of the present invention, the first step may comprise: coating photosensitive material on double sides or a single side of the leadframe material, exposing and developing to form a leadframe pattern (a step); and carrying out a plating on the leadframe pattern. (b step), whereby damage to a plating layer on the uppermost surface of the leadframe material can be prevented in advance during etching and reliability of the product can be enhanced.

In some exemplary embodiment of the present invention, the material applied to the process of forming the plating pattern in the first step may use a single alloy from one of Ni, Pd, Au, Sn, Ag, Co and Cu, or a binary alloy or ternary alloy, and may be in a single layer or a double layer.

In some exemplary embodiment of the present invention, the first step may preferably further comprise a (c) step of exfoliating the photosensitive material after forming the plating pattern.

In some exemplary embodiment of the present invention, the second step of forming a protective pattern on an upper surface of the plating pattern is a step of using a photolithography method by coating the photosensitive material on double sides or a single side of the leadframe material formed with the plating pattern.

To be more specific, the second step may comprise: coating the photosensitive material on double sides of the leadframe material, wherein an exposure/development of pattern are carried out on the upper surface of the leadframe material to form an upper protective pattern, and an overall exposure is carried out on the lower surface of the leadframe material to form a lower protective pattern.

In the forming of the protective pattern according to the present invention, the width (T1) of the upper protective pattern formed on the upper surface of the leadframe material is wider than the width (T2) of the plating pattern, thereby suppressing or eliminating the generation of plating burrs or undercut phenomenon occurring in the prior art.

The protective pattern may be preferably formed in a structure encompassing an upper portion and a lateral portion of the plating pattern.

In some exemplary embodiment of the present invention, the third step of forming a nano pattern on the leadframe material is a step of etching an exposed upper surface of the leadframe excluding the upper protective pattern portion.

In some exemplary embodiment of the present invention, a step of exfoliating the protective pattern is further included subsequent to the third step in the leadframe manufacturing process.

According to another aspect of the present invention, there is provided a manufacturing method of semiconductor package using multi-row leadframe, characterized by: forming a plating pattern on a leadframe material (first step); forming a protective pattern on the plating pattern (second step); forming a nano pattern using the protective pattern as a mask (third step); and exfoliating the protective pattern, and carrying out semiconductor chip mounting, wire bonding and epoxy molding, and completing the semiconductor package through back etching.

In the formation of a protective pattern during the leadframe forming process according to the present invention, the second step is preferably carried out in such a manner that the width (T1) of the upper protective pattern formed on the upper surface of the leadframe material is wider than the width (T2) of the plating pattern.

The structure for multi-row leadframe in the leadframe manufacturing method according to the present invention may comprise: forming at least one or more nano patterns on the upper surface or a lower surface of the leadframe material; and forming a leadframe including a plating pattern on one or more portions not formed with the nano pattern, where a photosensitive protective pattern is formed on an upper surface of the plating pattern. Particularly, a width (T3) of the upper pattern surface of the leadframe is wider than the width (T2) of the plating pattern. Of course, the protective pattern is preferably exfoliated in the formation of the semiconductor package.

In the manufacturing method of leadframe according to the present invention thus described, a periphery of the leadframe strip is not formed with the plating pattern but formed with a leadframe of exposed structure, thereby saving the material cost.

The plating pattern may use a single alloy from one of Ni, Pd, Au, Sn, Ag, Co and Cu, or a binary alloy or ternary alloy, and may be in a single layer or a double layer.

Advantageous Effects of Invention

The advantageous effect is that a protective pattern is formed on an upper surface of a plating pattern to increase reliability of a product by preventing damage of a plating layer caused by etching solution during pattern formation of leadframe.

Another advantageous effect is that a process of de-burring the plating burrs that is essentially carried out in using the plating layer as an etching mask is dispensed with, thereby shortening a manufacturing process and reducing the lost material cost.

Still another advantageous effect is that cause of unnecessary increase of material cost involving the plating of periphery of strip for manufacturing the leadframe has been removed to thereby save the manufacturing cost.

BRIEF DESCRIPTION OF DRAWINGS

FIGS. 1 and 2 illustrate a process chart and a conceptual drawing explaining a manufacturing method of semiconductor package and a problem involved therein according to the conventional art.

BEST MODE FOR CARRYING OUT THE INVENTION

A detailed description of exemplary embodiments of structure for multi-row lead frame and semiconductor package thereof and manufacturing method thereof will be described in detail with reference to the accompanying drawings.

For the purpose of clarity, technical material that is known in the technical fields related to the disclosure has not been described in detail so that the disclosure is not unnecessarily obscured.

Furthermore, terms and phrases used in the specification and claims may be interpreted or vary in consideration of construction and use of the present invention according to intentions of an operator or customary usages. The terms and phrases therefore should be defined based on the contents across an entire specification.

Exemplary Embodiment

The subject matter of the present invention is that, in the manufacturing method of multi-row leadframe, the overall obverse and reverse surfaces of a lead frame material are coated with resist film for forming a leadframe pattern, and a photoresist is used as protective pattern of the plating pattern, such that the plating layer on the upper surface is prevented from damage, whereby product reliability can be enhanced.

Now, a configuration and operation will be described in detail with reference to the accompanying drawings.

Figure 1:
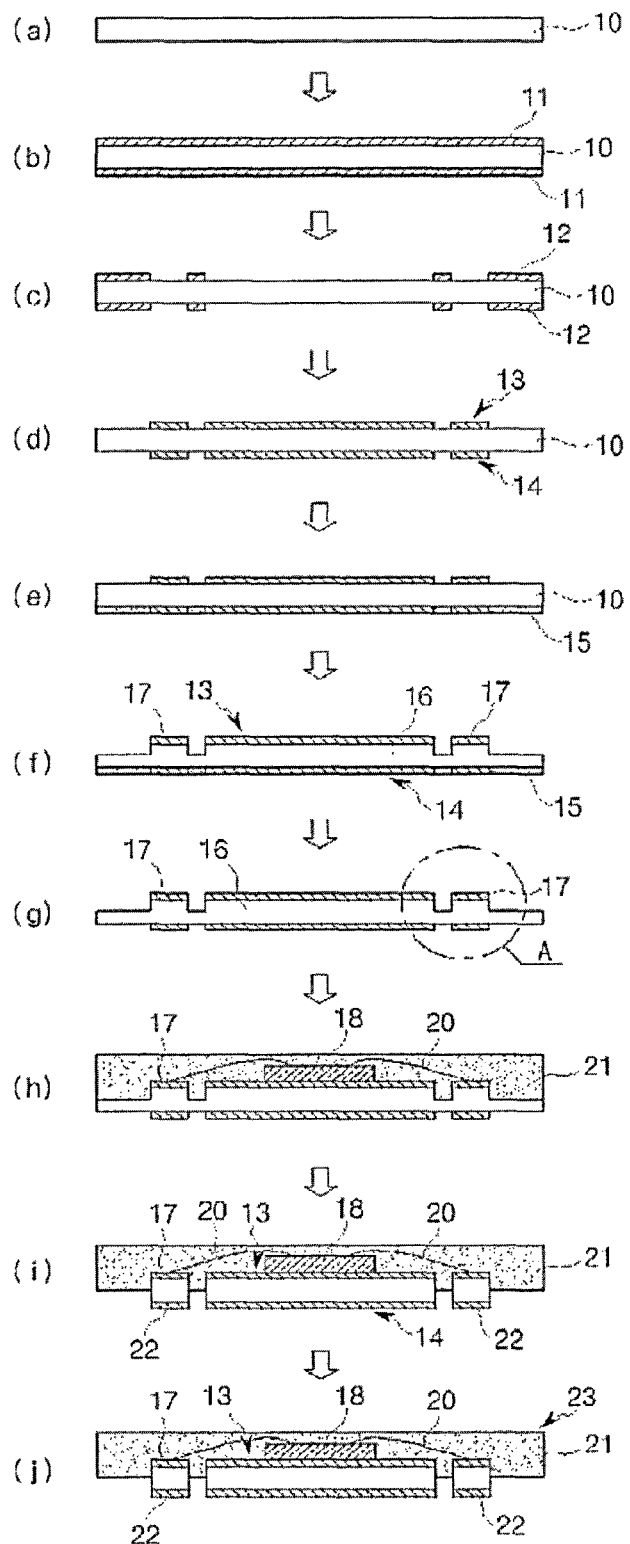
Figure 3:
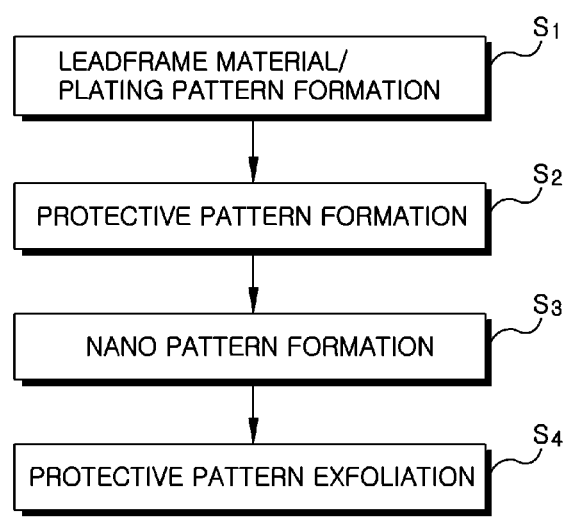
FIGS. 3 and 4 illustrate drawings showing processing orders of manufacturing method of multi-row leadframe according to the present invention.
Figure 4:
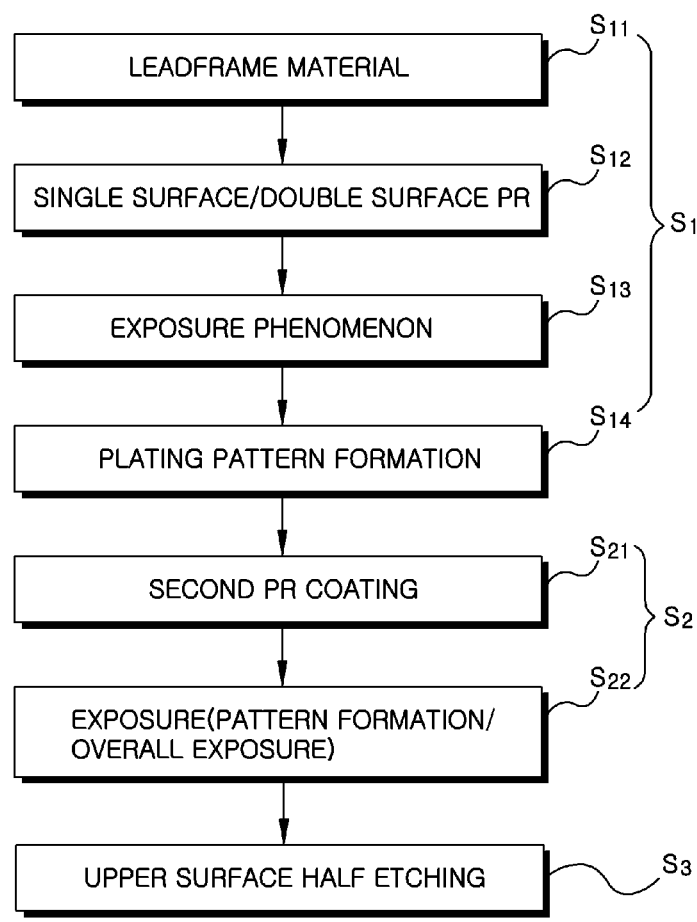

FIGS. 3 and 4 illustrate drawings showing processing orders of manufacturing method of multi-row leadframe according to the present invention.

Referring to FIG. 3, the manufacturing method of multi-row leadframe according to the present invention comprises: a first step of forming a plating pattern on a leadframe material (S1); a second step of forming a protective pattern on the plating pattern (S2); and a third step of forming a nano pattern by using the protective pattern as a mask (S3).

Of course, the method may further comprise an additional process of exfoliating the protective pattern for semiconductor packaging (S4).

As illustrated in FIG. 4, the first step (S1) of forming a plating pattern on a leadframe material may include preparing a leadframe material (S11), coating (S12) photosensitive material on the leadframe material, exposing and developing to form a leadframe pattern (13), and exfoliating the photoresist leaving the plating pattern (S14).

The second step of forming a protective pattern (S2) may include coating second time the photoresist on an upper surface of the leadframe material formed with the plating pattern (S21), and carrying out an exposure on an the upper and lower surface of the leadframe for forming respective patterns and an overall exposure (S22).

Then, the upper surface of the leadframe is subjected to half etching using the protective pattern as a mask to complete the multi-row leadframe. The protective pattern is preferably exfoliated later.

The above-described process will be explained in more detail with reference to FIG. 5.

First of all, a leadframe material (110) is prepared for forming a plating pattern (R1). The material applied to the process of forming the plating pattern may use, for example, Cu, or a Cu alloy, or an iron/nickel alloy.

Next, a photosensitive material (120) is coated (R2) on the upper and lower surface of the leadframe material (110). The photosensitive material may use a photoresist (PR), a dry film resist (DFR), a photo solder resist (PSR), or the like. At this time, the photosensitive material (PR, DFR, PSR) may be coated on the double sides or a single side of the leadframe material (110). The present exemplary embodiment of the present invention will be centered on coating on double sides of the leadframe material (110).

Thereafter, the coated photosensitive material is exposed and developed (R3, R4) using a predetermined leadframe as a mask (130). In this case, as shown in R4, a plating mask pattern (120) is formed on the upper surface of the leadframe material (110).

Next, a single layer or a double layer plating process is carried out for forming a multi-row leadframe using the plating mask pattern (120) as a mask (R5). Exfoliation of the plating mask pattern (120) following the plating leads to formation of a plating pattern (140) (R6). The material used for the plating may be a single alloy from one of Ni, Pd, Au, Sn, Ag, Co and Cu, or a binary alloy or ternary alloy, and may be in a single layer or a double layer.

Successively, in the step of R7, the above-described step of R6 is carried out for forming a nano pattern for forming the lead pattern, and photosensitive material is coated on the upper surface and the lower surface of the leadframe.

An exposure/development are carried out on the upper surface of the leadframe for forming a protective pattern for formation of etching mask (150), and an overall exposure (151) is carried out on the lower surface. The most important subject matter of this process step is to form a protective pattern for protecting a plating pattern by preventing an attack on the plating layer in the etching process.

Now, referring to the step of R8, a protective pattern (160) is formed on the plating pattern (140) on the upper surface of the leadframe material (110) to thereby provide an overall protection on the lower surface of the plating pattern (140) according to an overall exposure. In the step of R9, an etching is carried out for forming a nano pattern (P1) using the protective pattern as a mask. Thereafter, the protective pattern is removed to complete the multi-row leadframe according to the present invention (R10).

Now, an improved process and an effect resultant therefrom over those of the prior art will be described with reference to FIG. 6.

Figure 5:
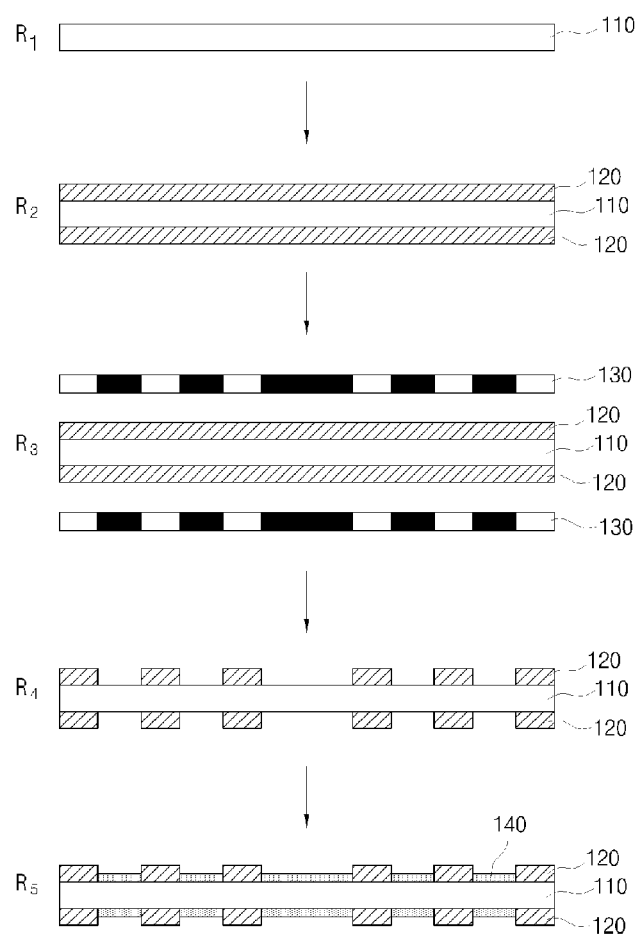
FIGS. 5 and 6 illustrate conceptual drawings showing a manufacturing method of multi-row leadframe according to the present invention.
Figure 6:
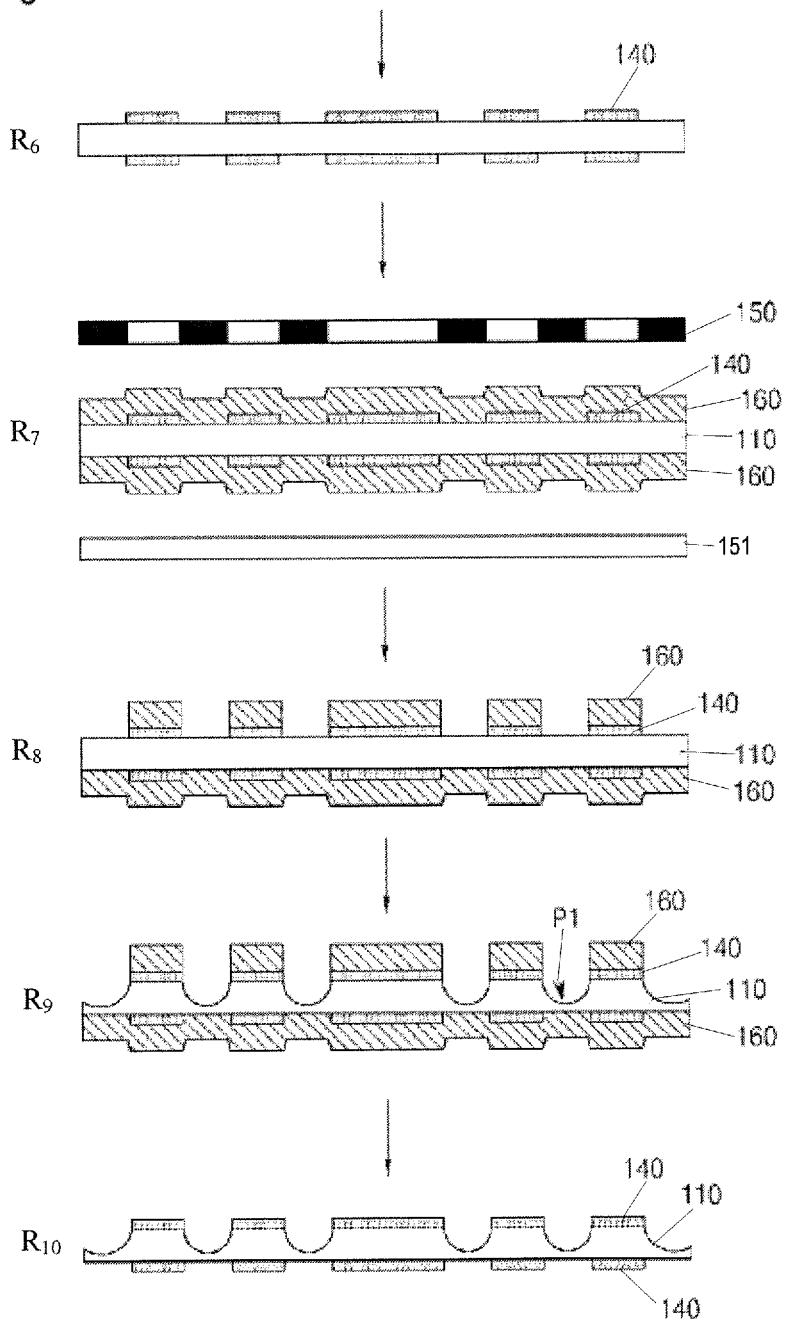

Basically, the process of forming a plating pattern on the leadframe material is the common process as in R1-R6 illustrated in FIGS. 5 and 6.

Now, referring to comparative process, the illustrate (A) process is the conventional process of forming a nano pattern, and (B) process is the process of forming a nano pattern according to the present invention.

In the (A) process, a photosensitive material (160) is coated on the lower surface of the leadframe material (110) (R7'), a nano pattern is formed using the plating pattern formed on the upper surface as an etching mask (R8').

Thereafter, the exfoliation of the photosensitive material leads to formation of leadframe as in the process of R9'. However, the formation of nano pattern using the plating pattern as an etching mask as in the conventional method will generate the plating burrs to create a problem of broadening a width of the plating pattern wider than that of the leadframe formed with the plating pattern.

Figure 7:
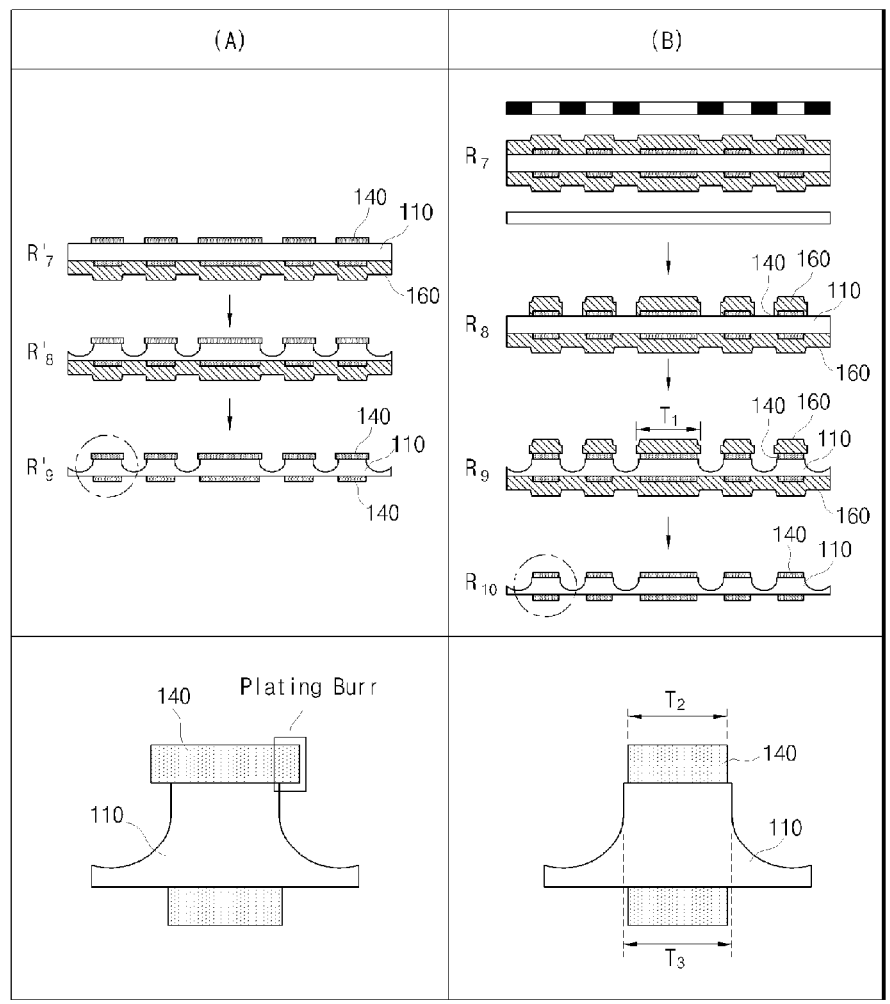
FIGS. 7 and 8 illustrate comparative drawings explaining strong points of manufacturing process according to the present invention by comparing with the prior art.

In comparison thereto, referring to (B) process according to the present invention, a photosensitive material is coated on the upper surface and the lower surface of the leadframe material formed with plating pattern (R7), and a protective pattern (160) is formed through exposure/development processes (R8). The structural shape of the upper protective pattern proposed in the R8 process of FIG. 6 is a little bit different from that of the protective pattern (160, an upper protective pattern of leadframe) suggested in R8 of FIG. 7. Namely, it should be apparent that the protective pattern may be formed on the upper surface of the plating pattern, and the protective pattern may be structured in a manner of wrapping the upper surface and a lateral surface of the plating pattern (140) as shown in R8 of FIG. 7.

Particularly, the drawings below the (A) and (B) processes show an enlarged drawings of principal parts in which parts of the plating pattern are enlarged. Referring to the enlarged drawings, the width (T1) of the protective pattern (160) is wider than the width (T2) of the plating pattern. Then, even in a case of an etching being carried out up to a lower surface of the protective pattern, the etching is carried out in the manner of the width (T3) of pattern surface of the leadframe formed with the plating pattern being wider than or equal to the width (T2) of the plating pattern, whereby there is generated an advantage of preventing the plating burrs or undercut phenomenon (i.e., T3=T2).

Particularly, another strong point of the present invention will be described with reference to FIG. 8.

Figure 8:
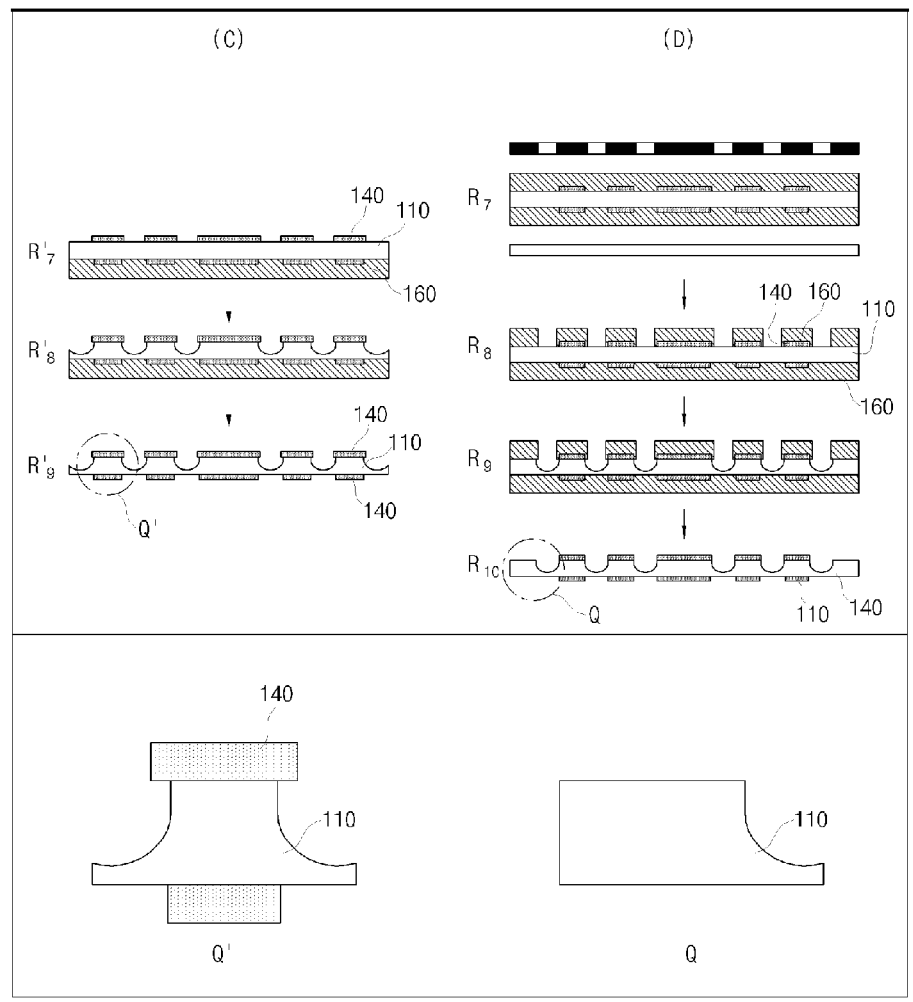

FIG. 8 illustrates a process of forming in strip unit in the formation of leadframe according to the present invention. Basically, the process of forming a plating pattern on the leadframe material is the common process as in R1-R6 illustrated in FIGS. 5 and 6.

The drawing (C) defines a conventional process chart, while the lower drawing shows an enlarged view (Q') of principal parts. The drawing (D) defines a process chart according to the present invention, while the lower drawing shows an enlarged view of Q portion.

Referring to the conventional (C) process, a photosensitive material is coated on the lower surface of the leadframe material formed with the plating pattern (R7'), a nano pattern is formed by using the plating pattern as an etching mask (R8') and the photosensitive material on the lower surface is exfoliated to complete the leadframe (R9'). However, this process is inevitably forced to carry out a plating operation on the periphery (Q) of the strip.

To be more specific, in the case of the conventional process of using the plating layer on the upper surface of the leadframe as an etching mask, there is a risk of damaging the plating layer on the upper surface during the etching process, which can cause the degradation of reliability of the wire bonding and the product.

Furthermore, in the conventional method of using the plating layer that uses a nobel metal as an etching mask, an overall periphery of the strip is all etched during half etching for nano pattern formation in a case of plating only the lead and the die pad portion, making it to be difficult to maintain the strip shape, and as the plating of the periphery of the strip is a region (Q') that must be included, the nobel metal plating of unnecessary portion inevitably increases the material cost.

Meanwhile, referring to the (D) process, a protective pattern is formed by coating photosensitive material (R7, R8) on the leadframe material for forming the protective pattern, an etching is carried out for forming the nano pattern, whereby the plating on the periphery (Q) of the strip can be dispensed with. As a result, the periphery (Q) of the leadframe strip is not formed with the plating pattern to thereby have an exposed structure.

That is, the present invention can obtain an effect of saving material cost by removing the problem of carrying out the nobel metal plating onto the periphery of the leadframe strip other than the lead and die pad portions for preventing the etching of the strip peripheral portion that was performed during the conventional process.

In addition, according to the present invention, the second time coating of the photoresist on the upper and lower surface at the same time can prevent the damage to the plating layer on the upper surface during the etching performance, whereby the product reliability can be enhanced.

Besides, the additional process of removing the plating burrs in the multi-row leadframe manufacturing method according to the prior art can be dispensed with to thereby obtain an effect of reducing the cost in the process.

Now, referring to FIGS. 9 and 10, a manufacturing process of semiconductor package using the multi-row leadframe according to the present invention will be described.

Figure 9:
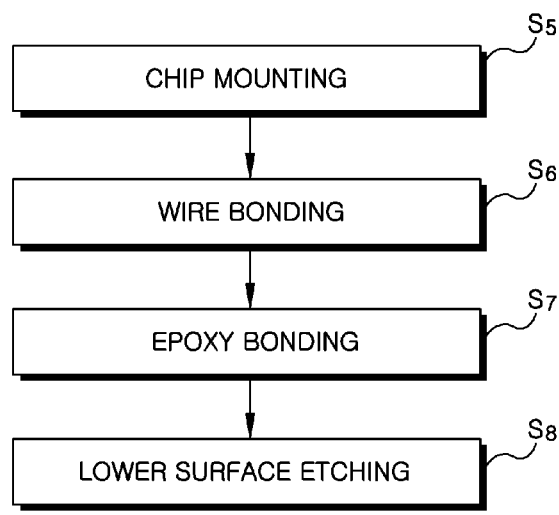
FIGS. 9 and 10 illustrate a process chart and a conceptual drawing for manufacturing the semiconductor package using the multi-row leadframe according to the present invention.
Figure 10:
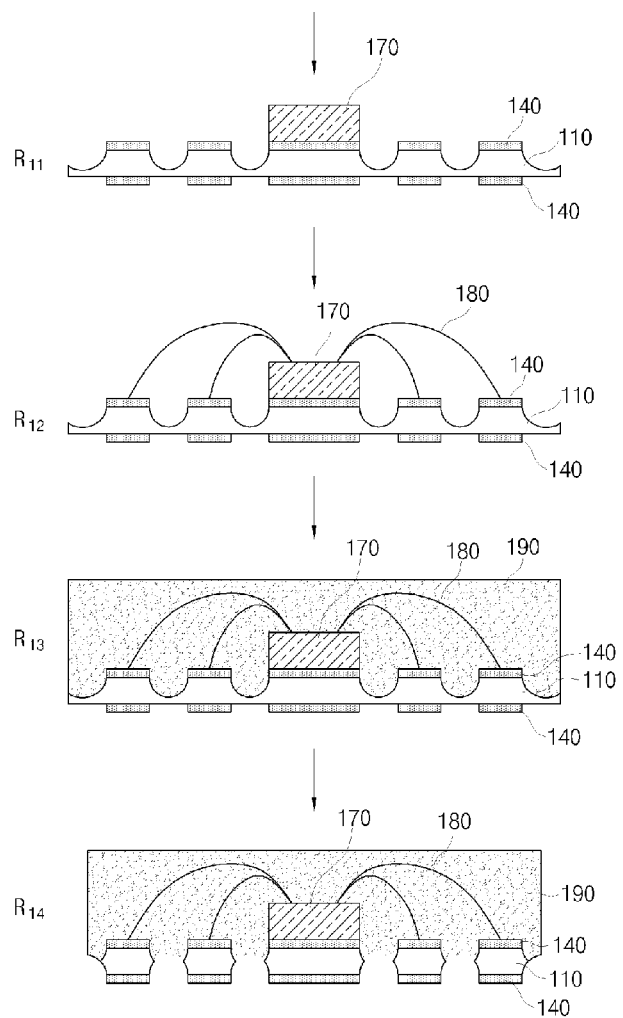

As shown in FIG. 9, the semiconductor packaging process may include a chip mounting on the leadframe (S5), a wire bonding (S6), an epoxy molding (S7) and etching on the lower surface (S8).

A more detailed explanation will be given with reference to FIG. 10.

A semiconductor chip (170) is mounted on a die pad portion of the leadframe (R11), a wire bonding is carried out for connecting the semiconductor chip (170) to a plating portion (140) using a wire (180) (R12), and a molding is carried out using material including epoxy or the like to form a semiconductor package (R13).

A back etching is also carried out for the lower surface of the semiconductor package to etch the lower surface using a predetermined pattern (P2), whereby an etching process is carried out on the lower surface for forming independent input/output terminals to complete the semiconductor package (R14).

The foregoing written specification is to be considered to be sufficient to enable one skilled in the art to practice the invention. While the best mode for carrying out the invention has been described in detail, those skilled in the art to which this invention relates will recognize various alternative embodiments including those mentioned above as defined by the following claims. The exemplary embodiments disclosed herein are not to be construed as limiting of the invention as they are intended merely as illustrative of particular embodiments of the invention as enabled herein.

Therefore, structures and methods that are functionally equivalent to those described herein are within the spirit and scope of the claims appended hereto. Indeed, various modifications of the invention in addition to those shown and described herein will become apparent to those skilled in the art from the foregoing description and fall within the scope of the appended claims.

INDUSTRIAL APPLICABILITY

A protective pattern is formed on an upper surface of a plating pattern to increase reliability of a product by preventing damage of a plating layer caused by etching solution during pattern formation of leadframe. A process of de-burring the plating burrs that is essentially carried out in using the plating layer as an etching mask is dispensed with, thereby shortening a manufacturing process and reducing the lost material cost. A cause of unnecessary increase of material cost involving the plating of periphery of strip for manufacturing the leadframe has been removed to thereby save the manufacturing cost.

The invention claimed is:

1. A manufacturing method of multi-row leadframe, comprising:
   forming a plating pattern on a leadframe material (first step);
   forming a protective pattern on the plating pattern (second step); and
   forming a pattern by using the protective pattern as a mask (third step);
   wherein a width (T1) of an upper protective pattern formed on an upper surface of the leadframe material is wider than a width (T2) of the plating pattern; and
   wherein the first step of forming a plating pattern on the leadframe material includes: coating photosensitive material on double sides or a single side of the leadframe material, exposing and developing to form a leadframe pattern (a step); and carrying out a plating on the leadframe pattern (b step).

2. The method of claim 1, wherein the material applied to the process of forming the plating pattern in the first step uses a single alloy from one of Ni, Pd, Au, Sn, Ag, Co, and Cu, or a binary alloy or ternary alloy, and is in a single layer or a double layer.

3. The method of claim 1, wherein the first step further comprises a (c) step of exfoliating the photosensitive material after forming the plating pattern.

4. A manufacturing method of multi-row leadframe, comprising:
   forming a plating pattern on a leadframe material (first step);
   forming a protective pattern on the plating pattern (second step);and
   forming a pattern by using the protective pattern as a mask (third step);
   wherein a width (T1) of an upper protective pattern formed on an upper surface of the leadframe material is wider than a width (T2) of the plating pattern, and
   wherein the second step includes using a photolithography method by coating the photosensitive material on double sides or a single side of the leadframe material formed with the plating pattern.

5. The method of claim 4, wherein the second step includes:
   coating the photosensitive material on double sides of the leadframe material,
   wherein an exposure and development of pattern are carried out on the upper surface of the leadframe material to form an upper protective pattern, and
   an overal exposure is carried out on the lower surface of the leadframe material to form a lower protective pattern.

6. A manufacturing method of multi-row leadframe, comprising:
   forming a plating pattern on a leadframe material (first step);
   forming a protective pattern on the plating pattern (second step); and
   forming a pattern by using the protective pattern as a mask (third step);
   wherein a width (T1) of an upper protective pattern formed on an upper surface of the leadframe material is wider than a width (T2) of the plating pattern,
   wherein the protective pattern is formed in a structure encompassing an upper portion and a lateral portion of the plating pattern,
   wherein the third step includes etching an exposed upper surface of the leadframe excluding an upper protective pattern portion, and
   wherein a step of exfoliating the protective pattern is further included subsequent to the third step.

7. A manufacturing method of semiconductor package using multi-row leadframe, the method comprising:
   forming a plating pattern on a leadframe material (first step);
   forming a protective pattern on the plating pattern (second step);
   forming a pattern using the protective pattern as a mask (third step); and
   exfoliating the protective pattern, and carrying out semiconductor chip mounting, wire bonding and epoxy molding, and completing the semiconductor package through back etching (fourth step),
   wherein the second step is characterized in that a width (T1) of an upper protective pattern formed on an upper surface of the leadframe material is wider than a width (T2) of the plating pattern.

8. The method of claim 7, wherein the first step of forming a plating pattern on the leadframe material includes: coating photosensitive material on double sides or a single side of the leadframe material, exposing and developing to form a leadframe pattern (a step); and carrying out a plating on the leadframe pattern (b step).

9. The method of claim 7, wherein the second step includes using a photolithography method by coating the photosensitive material on double sides or a single side of the leadframe material formed with the plating pattern.

10. A structure for multi-row leadframe in the leadframe manufacturing method, comprising:
    forming at least one or more patterns on an upper surface or a lower surface of the leadframe; and
    forming the leadframe including a plating pattern on one or more portions not formed with the pattern, wherein a width (T3) of the upper pattern surface of the leadframe is wider than the width (T2) of the plating pattern; and
    wherein a periphery of a leadframe strip is formed with an exposed structure.

11. A semiconductor package, comprising:
forming at least one or more patterns on an upper surface or a lower surface of a leadframe material; and
forming a leadframe including a plating pattern on one or more portions not formed with the pattern, wherein the semiconductor package is characterized by:
a multi-row leadframe having a width (T3) of the upper pattern surface of the leadframe that is wider than a width (T2) of the plating pattern;
a semiconductor chip;
a wire bonding; and
an epoxy molding.

* * * * *